US 8,531,176 B2

(12) United States Patent
    Roach

(10) Patent No.: US 8,531,176 B2
(45) Date of Patent: Sep. 10, 2013

(54) DRIVING AN ELECTRONIC INSTRUMENT

(75) Inventor: Steven D. Roach, Colorado Springs, CO (US)

(73) Assignee: Teradyne, Inc., North Reading, MA (US)

( * ) Notice: Subject to any disclaimer, the term of this patent is extended or adjusted under 35 U.S.C. 154(b) by 586 days.

(21) Appl. No.: 12/769,082

(22) Filed: Apr. 28, 2010

(65) Prior Publication Data

US 2011/0267030 A1    Nov. 3, 2011

(51) Int. Cl.
    *G01R 27/02*    (2006.01)
(52) U.S. Cl.
    USPC ............... 324/76.12; 324/76.39; 324/76.77; 327/333; 327/525; 327/74; 327/92; 327/345; 327/563
(58) Field of Classification Search
    USPC .................. 324/76.12, 76.39, 76.77
    See application file for complete search history.

(56) References Cited

U.S. PATENT DOCUMENTS

| | | | |
|---|---|---|---|
| 2,778,883 A | 1/1957 | Buckerfield | |
| 3,573,644 A | 4/1971 | Evel | |
| 3,927,374 A * | 12/1975 | Nakaya | 327/92 |
| 4,097,798 A * | 6/1978 | Olson et al. | 324/76.62 |
| 4,119,910 A * | 10/1978 | Hayashi | 324/76.77 |
| 4,147,988 A | 4/1979 | Hall | |
| 4,283,713 A | 8/1981 | Philipp | |
| 4,360,747 A * | 11/1982 | Ryan | 377/104 |
| 4,365,193 A | 12/1982 | Bollero et al. | |
| 4,495,586 A | 1/1985 | Andrews | |
| 4,507,618 A | 3/1985 | Nelson | |
| 4,523,161 A | 6/1985 | Miles | |
| 4,628,253 A * | 12/1986 | Yu et al. | 324/73.1 |
| 4,647,862 A * | 3/1987 | Blair | 327/74 |
| 4,647,915 A * | 3/1987 | Shank et al. | 345/157 |
| 4,678,345 A | 7/1987 | Agoston | |
| 4,694,244 A | 9/1987 | Whiteside et al. | |

(Continued)

FOREIGN PATENT DOCUMENTS

| | | |
|---|---|---|
| AT | 264510 | 4/2004 |
| AU | 200027578 | 4/2001 |

(Continued)

OTHER PUBLICATIONS

Roach, Steven D., "Signal Conditioning in Oscilloscopes and the Spirit of Invention", in the Art and Science of Analog Circuit Design, ed. Jim Williams, Butterworth-Heinemann, Boston (1995).

(Continued)

*Primary Examiner* — Arleen M Vazquez
*Assistant Examiner* — Lamarr Brown
(74) *Attorney, Agent, or Firm* — Fish & Richardson P.C.

(57) ABSTRACT

Circuitry includes a pre-amplifier having a differential output, where the differential output corresponds to a common mode voltage; a multiplexer including sets of transistors, each of which has a control input; a comparator including input terminals, a first terminal of the input terminals to receive a signal that is based on an output of the multiplexer, and a second terminal of the input terminals to receive a threshold voltage; a compensation circuit to produce a divided voltage that varies in accordance with variations in the common mode voltage; and an amplifier to receive a predefined voltage and to use the divided voltage to affect the predefined voltage to produce the threshold voltage for the comparator. Signals in the differential output of the pre-amplifier are applicable to corresponding control inputs in the sets of transistors.

20 Claims, 3 Drawing Sheets

(56) References Cited

U.S. PATENT DOCUMENTS

| | | | | |
|---|---|---|---|---|
| 4,704,036 | A | 11/1987 | Holte et al. | |
| 4,716,345 | A | 12/1987 | Shank et al. | |
| 4,755,951 | A | 7/1988 | Hollister | |
| 4,779,045 | A | 10/1988 | Shank | |
| 4,855,968 | A | 8/1989 | Shank | |
| 5,034,698 | A | 7/1991 | Moriyasu | |
| 5,097,147 | A * | 3/1992 | Stuebing et al. | 327/74 |
| 5,119,404 | A * | 6/1992 | Aihara | 375/318 |
| 5,121,075 | A | 6/1992 | Roach | |
| 5,180,932 | A * | 1/1993 | Bengel | 327/362 |
| 5,222,028 | A * | 6/1993 | LaBarre et al. | 702/73 |
| 5,223,784 | A | 6/1993 | Nelson et al. | |
| 5,225,776 | A * | 7/1993 | Dobos et al. | 324/121 R |
| 5,289,500 | A * | 2/1994 | Inou et al. | 375/224 |
| 5,315,627 | A | 5/1994 | Draving | |
| 5,319,266 | A * | 6/1994 | Chu et al. | 327/91 |
| 5,498,985 | A * | 3/1996 | Parle et al. | 327/74 |
| 5,706,222 | A * | 1/1998 | Bonaccio et al. | 708/841 |
| 5,754,827 | A | 5/1998 | Barbier et al. | |
| 5,777,489 | A | 7/1998 | Barbier et al. | |
| 5,912,593 | A * | 6/1999 | Susak et al. | 331/111 |
| 5,933,129 | A | 8/1999 | Egami et al. | |
| 6,057,706 | A | 5/2000 | Barbier et al. | |
| 6,218,904 | B1 | 4/2001 | Panther | |
| 6,265,894 | B1 | 7/2001 | Reblewski et al. | |
| 6,366,154 | B2 * | 4/2002 | Pulvirenti | 327/525 |
| 6,377,106 | B1 * | 4/2002 | Rozsypal | 327/333 |
| 6,388,465 | B1 | 5/2002 | Barbier et al. | |
| 6,400,219 | B1 * | 6/2002 | Fayed | 330/9 |
| 6,473,701 | B1 * | 10/2002 | Tallman et al. | 702/67 |
| 6,522,083 | B1 * | 2/2003 | Roach | 315/224 |
| 6,560,494 | B1 | 5/2003 | Soto et al. | |
| 6,621,913 | B1 * | 9/2003 | de Vries | 382/100 |
| 6,681,354 | B2 | 1/2004 | Gupta | |
| 6,701,280 | B2 * | 3/2004 | Horne et al. | 702/177 |
| 6,717,433 | B2 | 4/2004 | Barbier et al. | |
| 6,782,298 | B2 | 8/2004 | Soto et al. | |
| 6,801,097 | B2 | 10/2004 | Wallace | |
| 6,807,496 | B2 | 10/2004 | Pickerd | |
| 6,812,688 | B2 | 11/2004 | Tan et al. | |
| 6,819,170 | B1 * | 11/2004 | Kindt | 327/563 |
| 6,832,174 | B2 | 12/2004 | Tran et al. | |
| 6,909,979 | B2 | 6/2005 | Saitou et al. | |
| 6,927,608 | B1 * | 8/2005 | Chen et al. | 327/108 |
| 7,058,548 | B2 | 6/2006 | Pupalaikis et al. | |
| 7,065,458 | B2 | 6/2006 | Tran et al. | |
| 7,072,804 | B2 | 7/2006 | Weller | |
| 7,139,684 | B2 | 11/2006 | Pupalaikis et al. | |
| 7,148,754 | B2 * | 12/2006 | Kaminski | 331/11 |
| 7,191,079 | B2 | 3/2007 | Smith et al. | |
| 7,191,372 | B1 | 3/2007 | Jacobson et al. | |
| 7,219,037 | B2 | 5/2007 | Pupalaikis et al. | |
| 7,222,055 | B2 | 5/2007 | Pupalaikis et al. | |
| 7,236,900 | B2 | 6/2007 | Hagen et al. | |
| 7,245,163 | B2 * | 7/2007 | Nakamura | 327/110 |
| 7,262,632 | B2 * | 8/2007 | Hazucha et al. | 326/38 |
| 7,280,930 | B2 | 10/2007 | Kobayashi | |
| 7,282,965 | B2 * | 10/2007 | Hatooka et al. | 327/80 |
| 7,285,946 | B2 | 10/2007 | Ems et al. | |
| 7,304,550 | B2 | 12/2007 | Rostami et al. | |
| 7,365,617 | B2 | 4/2008 | Rostami et al. | |
| 7,373,281 | B2 | 5/2008 | Pupalaikis et al. | |
| 7,386,409 | B2 | 6/2008 | Mueller et al. | |
| 7,394,410 | B1 | 7/2008 | Wegener | |
| 7,519,513 | B2 | 4/2009 | Pupalaikis et al. | |
| 7,616,066 | B2 * | 11/2009 | Ishii et al. | 331/16 |
| 7,642,822 | B2 * | 1/2010 | Baker et al. | 327/156 |
| 7,646,766 | B2 | 1/2010 | Schmidt et al. | |
| 7,868,664 | B2 * | 1/2011 | Markozen et al. | 327/65 |
| 7,881,414 | B2 * | 2/2011 | Kimura et al. | 375/354 |
| 7,944,229 | B2 | 5/2011 | Joshi et al. | |
| 8,073,656 | B2 | 12/2011 | Pupalaikis et al. | |
| 8,239,158 | B2 | 8/2012 | Crain et al. | |
| 8,305,903 | B1 | 11/2012 | Louise et al. | |
| 8,386,208 | B2 | 2/2013 | Cake et al. | |
| 8,433,532 | B2 | 4/2013 | LeBrun | |
| 8,433,543 | B2 | 4/2013 | LeBrun | |
| 2002/0089349 | A1 | 7/2002 | Barbier et al. | |
| 2002/0104051 | A1 | 8/2002 | Gupta | |
| 2002/0175732 | A1 * | 11/2002 | Blon et al. | 327/307 |
| 2002/0175739 | A1 * | 11/2002 | Sidiropoulos et al. | 327/345 |
| 2002/0196013 | A1 * | 12/2002 | Goldstein et al. | 324/158.1 |
| 2003/0090299 | A1 * | 5/2003 | Dathe et al. | 327/77 |
| 2003/0184349 | A1 * | 10/2003 | Carvajal et al. | 327/108 |
| 2003/0208330 | A1 | 11/2003 | Pickerd | |
| 2003/0223317 | A1 | 12/2003 | Soto et al. | |
| 2004/0012454 | A1 | 1/2004 | Wallace | |
| 2004/0117138 | A1 | 6/2004 | Tran et al. | |
| 2004/0117143 | A1 | 6/2004 | Tran et al. | |
| 2004/0128076 | A1 | 7/2004 | Pupalaikis et al. | |
| 2004/0178850 | A1 | 9/2004 | Barbier et al. | |
| 2005/0089883 | A1 | 4/2005 | Weinrich et al. | |
| 2005/0134324 | A1 * | 6/2005 | Boyer et al. | 327/50 |
| 2005/0174148 | A1 * | 8/2005 | Fiedler | 327/65 |
| 2005/0225310 | A1 | 10/2005 | Smith et al. | |
| 2005/0234670 | A1 | 10/2005 | Hagen et al. | |
| 2005/0261853 | A1 | 11/2005 | Dobyns | |
| 2006/0074606 | A1 | 4/2006 | Pupalaikis et al. | |
| 2006/0080065 | A1 | 4/2006 | Pupalaikis et al. | |
| 2006/0106502 | A1 | 5/2006 | See et al. | |
| 2006/0145768 | A1 * | 7/2006 | Kaminski | 331/16 |
| 2006/0161401 | A1 | 7/2006 | Pupalaikis et al. | |
| 2006/0176151 | A1 | 8/2006 | Ems et al. | |
| 2006/0177018 | A1 | 8/2006 | Kobayashi et al. | |
| 2006/0178850 | A1 | 8/2006 | Kobayashi | |
| 2006/0195301 | A1 | 8/2006 | Mueller et al. | |
| 2006/0202748 | A1 * | 9/2006 | Furukawa et al. | 327/560 |
| 2006/0238270 | A1 | 10/2006 | Rostami et al. | |
| 2006/0244494 | A1 * | 11/2006 | Cetrulo et al. | 327/103 |
| 2006/0259256 | A1 * | 11/2006 | Roach | 702/64 |
| 2007/0013449 | A1 * | 1/2007 | Ishii et al. | 331/16 |
| 2007/0027658 | A1 | 2/2007 | Pupalaikis et al. | |
| 2007/0069768 | A1 * | 3/2007 | Hatooka et al. | 327/74 |
| 2007/0112532 | A1 | 5/2007 | Pupalaikis et al. | |
| 2007/0126525 | A1 | 6/2007 | Nicholson | |
| 2007/0185669 | A1 | 8/2007 | Pupalaikis et al. | |
| 2007/0247256 | A1 | 10/2007 | Rostami et al. | |
| 2008/0054967 | A1 | 3/2008 | Kobayashi | |
| 2008/0061844 | A1 * | 3/2008 | Zeng et al. | 327/78 |
| 2008/0120053 | A1 | 5/2008 | Pupalaikis et al. | |
| 2008/0130654 | A1 | 6/2008 | Schmidt et al. | |
| 2008/0258957 | A1 | 10/2008 | Pupalaikis et al. | |
| 2008/0309355 | A1 * | 12/2008 | Nozaki et al. | 324/754 |
| 2009/0002213 | A1 | 1/2009 | LaMarche et al. | |
| 2009/0027086 | A1 * | 1/2009 | Trifonov | 327/66 |
| 2009/0066403 | A1 * | 3/2009 | Horsky et al. | 327/398 |
| 2009/0108906 | A1 * | 4/2009 | Butler | 327/387 |
| 2009/0251186 | A1 * | 10/2009 | Nedachi | 327/270 |
| 2009/0267666 | A1 * | 10/2009 | Marutani | 327/160 |
| 2010/0039157 | A1 * | 2/2010 | Kaeriyama et al. | 327/292 |
| 2010/0102868 | A1 * | 4/2010 | Kim et al. | 327/291 |
| 2010/0117699 | A1 * | 5/2010 | Wu et al. | 327/172 |
| 2010/0176847 | A1 * | 7/2010 | Kitsunezuka et al. | 327/103 |
| 2010/0182050 | A1 * | 7/2010 | Markozen et al. | 327/52 |
| 2011/0043270 | A1 * | 2/2011 | Kusuda | 327/337 |
| 2011/0115526 | A1 * | 5/2011 | Ouchi | 327/74 |
| 2011/0187424 | A1 * | 8/2011 | Grewing et al. | 327/156 |
| 2011/0191066 | A1 * | 8/2011 | Delbue et al. | 702/189 |
| 2011/0267036 | A1 * | 11/2011 | Kharrati et al. | 324/121 R |
| 2011/0267037 | A1 * | 11/2011 | Kharrati et al. | 324/121 R |
| 2011/0267214 | A1 * | 11/2011 | Roach | 341/155 |
| 2012/0212251 | A1 | 8/2012 | Yanagishima et al. | |

FOREIGN PATENT DOCUMENTS

| | | |
|---|---|---|
| AU | 2003252059 | 2/2004 |
| AU | 2003291653 | 5/2004 |
| CA | 1126866 | 6/1982 |
| CA | 1203295 | 4/1986 |
| CA | 1278344 | 12/1990 |
| CA | 2238955 | 11/1999 |
| CA | 2272740 | 11/1999 |
| CA | 2353950 | 4/2001 |
| CN | 1399724 | 2/2003 |
| CN | 1675822 | 9/2005 |

| | | |
|---|---:|---|
| CN | 1723621 | 1/2006 |
| CN | 101116066 | 1/2008 |
| DE | 2824103 | 12/1978 |
| DE | 3065612 | 12/1983 |
| DE | 3335868 | 4/1984 |
| DE | 60009856 | 5/2004 |
| DE | 102004019966 | 11/2005 |
| DE | 102006040793 | 6/2007 |
| EP | 0023708 | 2/1981 |
| EP | 0250682 | 1/1988 |
| EP | 0278637 | 8/1998 |
| EP | 1133702 | 9/2001 |
| EP | 1359427 | 11/2003 |
| EP | 1554807 | 7/2005 |
| EP | 1738185 | 1/2007 |
| EP | 1836586 | 9/2007 |
| EP | 1846770 | 10/2007 |
| EP | 1847103 | 10/2007 |
| FR | 2393472 | 12/1978 |
| FR | 2534090 | 4/1984 |
| GB | 1583550 | 1/1981 |
| GB | 2130038 | 5/1984 |
| GB | 2433659 | 6/2007 |
| IN | 00025CN2005 | 4/2007 |
| IT | 1119341 | 3/1986 |
| JP | 54-002019 | 1/1979 |
| JP | 59-086322 | 5/1984 |
| JP | 63-5270 | 1/1988 |
| JP | 63-193068 | 8/1988 |
| JP | 02-007609 | 1/1990 |
| JP | 02-052282 | 2/1990 |
| JP | 03-211695 | 9/1991 |
| JP | 04-212067 | 8/1992 |
| JP | 06-034666 | 2/1994 |
| JP | 09-318669 | 12/1997 |
| JP | 2002-544576 | 12/2002 |
| JP | 2003-329709 | 11/2003 |
| JP | 2006-504100 | 2/2006 |
| JP | 2007-159118 | 6/2007 |
| JP | 2008-521014 | 6/2008 |
| MX | PA05000704 | 4/2005 |
| NL | 7806065 | 12/1978 |
| NL | 8303383 | 5/1984 |
| NL | 8901648 | 1/1990 |
| NL | 187880 | 9/1991 |
| TW | 339409 | 9/1998 |
| WO | WO01/23901 | 4/2001 |
| WO | WO2004/010571 | 1/2004 |
| WO | WO2004/038432 | 5/2004 |
| WO | WO2005/103736 | 11/2005 |
| WO | WO2006/055935 | 5/2006 |
| WO | WO2006/086256 | 8/2006 |
| WO | WO2006/086257 | 8/2006 |
| WO | WO2006/086258 | 8/2006 |
| WO | WO2006/093541 | 9/2006 |

OTHER PUBLICATIONS

White Paper "XYZs of Oscilloscopes: Primer", TEK1511 / 03W-8605-5, (c) 2009 Tektronix.

Agilent Technologies Application Note 1608, "What is the difference between an equivalent time sampling oscilloscope and a real-time oscilloscope?", 5989-8794EN, (c) 2008 Agilent Technologies, Inc.

Search Report for U.S. Appl. No. 12/769,065 ,entitled "Fixed-Price Novelty Search Report" (2010).

Search Report for U.S. Appl. No. 12/769,082, entitled "Fixed-Price Novelty Search Report" (2010).

Search Report for U.S. Appl. No. 12/769,114, entitled "Fixed-Price Novelty Search Report " (2010).

Search Report for Application No. 12/769,075, entitled "Fixed-Price Novelty Search Report" (2010).

Highlighted U.S. Patent Publication No. US2004117138 (Tran et al., Pub Date: Jun. 17, 2004).

Action and Response History in US Publication No. US2004/0117138.

File History for US Patent No. 5,121,075 (Issue Date: Jun. 9, 1992).

Teradyne, Inc., "Prior Art Fig. 1: Ai760 DSO Rev A showing differential drive comparators with trigger level control . . . ", (Aug. 2007).

Teradyne, Inc., "Prior Art Fig. 1: Ai760 Rev A DSO and prior art references listed in Section 7", (Aug. 2007).

* cited by examiner

DRIVING AN ELECTRONIC INSTRUMENT

CROSS-REFERENCE TO RELATED APPLICATIONS

The following patent applications, all of which were filed on the same day, are related: (1) U.S. patent application Ser. No. 12/769,065, entitled "Connecting Digital Storage Oscilloscopes", (2) U.S. patent application Ser. No. 12/769,082, entitled "Driving An Electronic Instrument"; (3) U.S. patent application Ser. No. 12/769,114, entitled "Attenuator Circuit"; and (4) U.S. patent application Ser. No. 12/769,075, entitled "Multi-Level Triggering Circuit". The disclosure of each of these patent applications is hereby incorporated by reference into this patent application as if set forth herein in full.

TECHNICAL FIELD

This patent application relates generally to driving an electronic instrument, such as a digital storage oscilloscope.

BACKGROUND

An oscilloscope is a type of electronic instrument for graphically displaying measured electrical parameters, such as voltage. Typically, an oscilloscope's graphical display includes a two-dimensional plot of the electrical parameter versus time.

Originally, oscilloscope were analog devices, which displayed their graphics on a cathode ray tube (CRT). Newer types of oscilloscopes are digital. For example, a digital storage oscilloscope (DSO) can convert analog signals to digital form, store those signals, and process the signals for display, typically on a liquid crystal display (LCD) device.

DSOs having two channels are known. Each channel of a DSO drives trigger comparators to support advanced triggering modes, such as runt, window and transition time triggering.

SUMMARY

This patent application describes driving an electronic instrument, such as a digital storage oscilloscope (DSO)

For example, this patent application describes circuitry comprising a pre-amplifier having a differential output, where the differential output corresponds to a common mode voltage; a multiplexer comprised of sets of transistors, each of which has a control input; a comparator comprising input terminals, a first terminal of the input terminals to receive a signal that is based on an output of the multiplexer, and a second terminal of the input terminals to receive a threshold voltage; a compensation circuit to produce a divided voltage that varies in accordance with variations in the common mode voltage; and an amplifier to receive a predefined voltage and to use the divided voltage to affect the predefined voltage to produce the threshold voltage for the comparator. Signals in the differential output of the pre-amplifier are applicable to corresponding control inputs in the sets of transistors. This circuitry may include one or more of the following features, alone or in combination.

The transistors may comprise or be bipolar junction transistors. The control input of each transistor may comprise a base. Each transistor also may comprise an emitter and a collector. Transistors in the sets of transistors may be electrically connected collector-to-collector and emitter-to-emitter. The sets of transistor may comprise two pairs of transistors, each pair of which may be electrically connected collector-to-collector and emitter-to-emitter. The comparator may be configured to output a signal in response to the signal exceeding the threshold voltage. The amplifier may be configured to incorporate the divided voltage into the predefined voltage to produce the threshold voltage.

In one example, the pre-amplifier may be a first pre-amplifier, the common mode voltage may be a first common mode voltage, the comparator may be a first comparator, and the amplifier may be a first amplifier. The circuitry may comprise a second pre-amplifier having a differential output, where the differential output corresponds to a second common mode voltage; and a second comparator comprising second input terminals, a first terminal of the second input terminals to receive a second signal that is based on a second output of the multiplexer, and a second terminal of the second input terminals to receive a second threshold voltage. The compensation circuit may be configured to produce a second divided voltage that varies in accordance with variations in the second common mode voltage. A second amplifier may be configured to receive a second predefined voltage and to use the second divided voltage to affect the second predefined voltage to produce the second threshold voltage for the second comparator. Signals in the differential output of the second pre-amplifier may be applicable to corresponding control inputs in the sets of transistors.

The first common mode voltage and the second common mode voltage may each vary between low and high values. The circuitry may further comprise a first switch configured to apply the high value or the low value to the first pre-amplifier; and a second switch configured to apply the high value or the low value to the first pre-amplifier. The first and second switches may be configured so that the first switch applies the high value to the first pre-amplifier when the second switch applies the low value to the second pre-amplifier, and the second switch applies the high value to the first pre-amplifier when the first switch applies the low value to the second pre-amplifier.

The circuitry may further comprise a first digital-to-analog converter (DAC) configured to receive the differential output of the first pre-amplifier and, in response, to produce a first digital signal; and a second digital to analog converter configured to receive the differential output of the second pre-amplifier and, in response, to produce a second digital signal. The first amplifier may be configured to incorporate the first divided voltage into the first predefined voltage to produce the threshold voltage; and the second amplifier may be configured to incorporate the second divided voltage into the second predefined voltage to produce the second threshold voltage.

This patent application also describes a DSO comprising an analog to digital converter (ADC) to convert an input analog signal into a digital signal in accordance with a clock signal, and circuitry to generate a trigger signal. The circuitry comprises a pre-amplifier having a differential output, where the differential output corresponds to a common mode voltage; a multiplexer comprised of sets of transistors, each of which has a control input; a comparator comprising input terminals, a first terminal of the input terminals to receive a signal that is based on an output of the multiplexer, and a second terminal of the input terminals to receive a threshold voltage; a compensation circuit to produce a divided voltage that varies in accordance with variations in the common mode voltage; and an amplifier to receive a predefined voltage and to use the divided voltage to affect the predefined voltage to produce the threshold voltage for the comparator. Signals in the differential output of the pre-amplifier are applicable to corresponding control inputs in the sets of transistors. An edge selector is configured to identify a rising or falling edge of a signal output by the comparator and to produce an asynchronous trigger signal; and a latch is configured to output the trigger signal based on the asynchronous trigger signal and a version of a clock signal. A time interval digitizer is configured to determine a time difference that is based on the asynchronous trigger signal, where the time difference corresponds to a difference between an actual time that the trigger event occurred and a time that a clock signal running the ADC occurred. The DSO may include one or more of the following features, alone or in combination.

The DSO may comprise memory and a controller to capture data from the ADC based on the time difference and to store the data in the memory. The sets of transistor may comprise two pairs of transistors, each pair of which is electrically connected collector-to-collector and emitter-to-emitter. The comparator may be configured to output a signal in response to the signal exceeding the threshold voltage. The amplifier may be configured to incorporate the divided voltage into the predefined voltage to produce the threshold voltage.

The pre-amplifier may be a first pre-amplifier, the common mode voltage may be a first common mode voltage, the comparator may be a first comparator, the amplifier may be a first amplifier. The circuitry of the DSO may comprise a second pre-amplifier having a differential output, where operation of the second preamplifier is responsive to a second common mode voltage; and a second comparator comprising second input terminals, a first terminal of the second input terminals to receive a second signal that is based on a second output of the multiplexer, and a second terminal of the second input terminals to receive a second threshold voltage. The compensation circuit may be configured to produce a second divided voltage that varies in accordance with variations in the second common mode voltage. A second amplifier may be configured to receive a second predefined voltage and to use the second divided voltage to affect the second predefined voltage to produce the second threshold voltage for the second comparator. Signals in the differential output of the second pre-amplifier may be applicable to corresponding control inputs in the sets of transistors.

The first common mode voltage and the second common mode voltage may each vary between low and high values. The circuitry of the DSO may comprise a first switch configured to apply the high value or the low value to the first pre-amplifier; and a second switch configured to apply the high value or the low value to the first pre-amplifier. The first and second switches may be configured so that the first switch applies the high value to the first pre-amplifier when the second switch applies the low value to the second pre-amplifier, and the second switch applies the high value to the first pre-amplifier when the first switch applies the low value to the second pre-amplifier.

This patent application also describes a method of driving trigger comparators of a DSO or other type of electronic instrument. The method comprises controlling a set of pre-amplifiers so that a differential output from only one of the set of pre-amplifiers is applied to a multiplexer comprised of sets of transistors that are electrically connected to enable the differential output to control application of signals to a set of comparators; applying a threshold voltage to each comparator in the set of comparators; and outputting, from each comparator, a signal that is based on a corresponding threshold voltage and a corresponding signal applied as a result of the differential output. The method may include one or more of the following features, alone or in combination.

The differential output may have a common mode voltage. The method may further comprise tracking changes corresponding to the common mode voltage, and compensating the threshold voltage for the changes. Compensating the threshold voltage may comprise incorporating, into the threshold voltage, a voltage that corresponds to the changes.

Any two or more of the features described in this summary section may be combined to form embodiments not specifically described in this patent application.

All or part of the foregoing may be implemented as a computer program product comprised of instructions that are stored on one or more machine-readable media, and that are executable on one or more processing devices. All or part of the foregoing may be implemented as an apparatus, method, or system that may include one or more processing devices and memory to store executable instructions to implement functionality.

The details of one or more examples are set forth in the accompanying drawings and the description below. Further features, aspects, and advantages will become apparent from the description, the drawings, and the claims.

DETAILED DESCRIPTION

Described herein is way of driving trigger comparators of an instrument, such as a digital storage oscilloscope (DSO), from the differential output of a pre-amplifier using relatively simple circuitry. The circuitry supports relatively low signal loading, more precise control over trigger/threshold voltage levels, and intrinsic multiplexing of two or more channels into the trigger comparators. The circuitry enables conversion of a differential signal to two single-ended signals by separately buffering two components of the differential signal (positive and negative) using transistors in an emitter-follower configuration. The circuitry also provides a way to multiplex the two components of the differential signal into the trigger comparators, and a way to compensate for voltage errors inherent in differential-to-single-ended conversion by obtaining a common mode output voltage at an output of the transistors and incorporating that common mode output voltage into the threshold voltage.

In one example, the circuitry includes a pre-amplifier having a differential output, where the differential output corresponds to a common mode voltage; and a multiplexer comprised of sets of transistors, each of which has a control input. A comparator comprises input terminals, a first terminal of which is to receive a signal that is based on an output of the multiplexer, and a second terminal of which is to receive a threshold voltage. A compensation circuit is configured to produce a divided voltage that varies in accordance with variations in the common mode voltage; and an amplifier is configured to receive a predefined voltage and to use the divided voltage to affect the predefined voltage to produce the threshold voltage for the comparator. Signals in the differential output of the pre-amplifier are applicable to corresponding control inputs in the sets of transistors.

Figure 1:
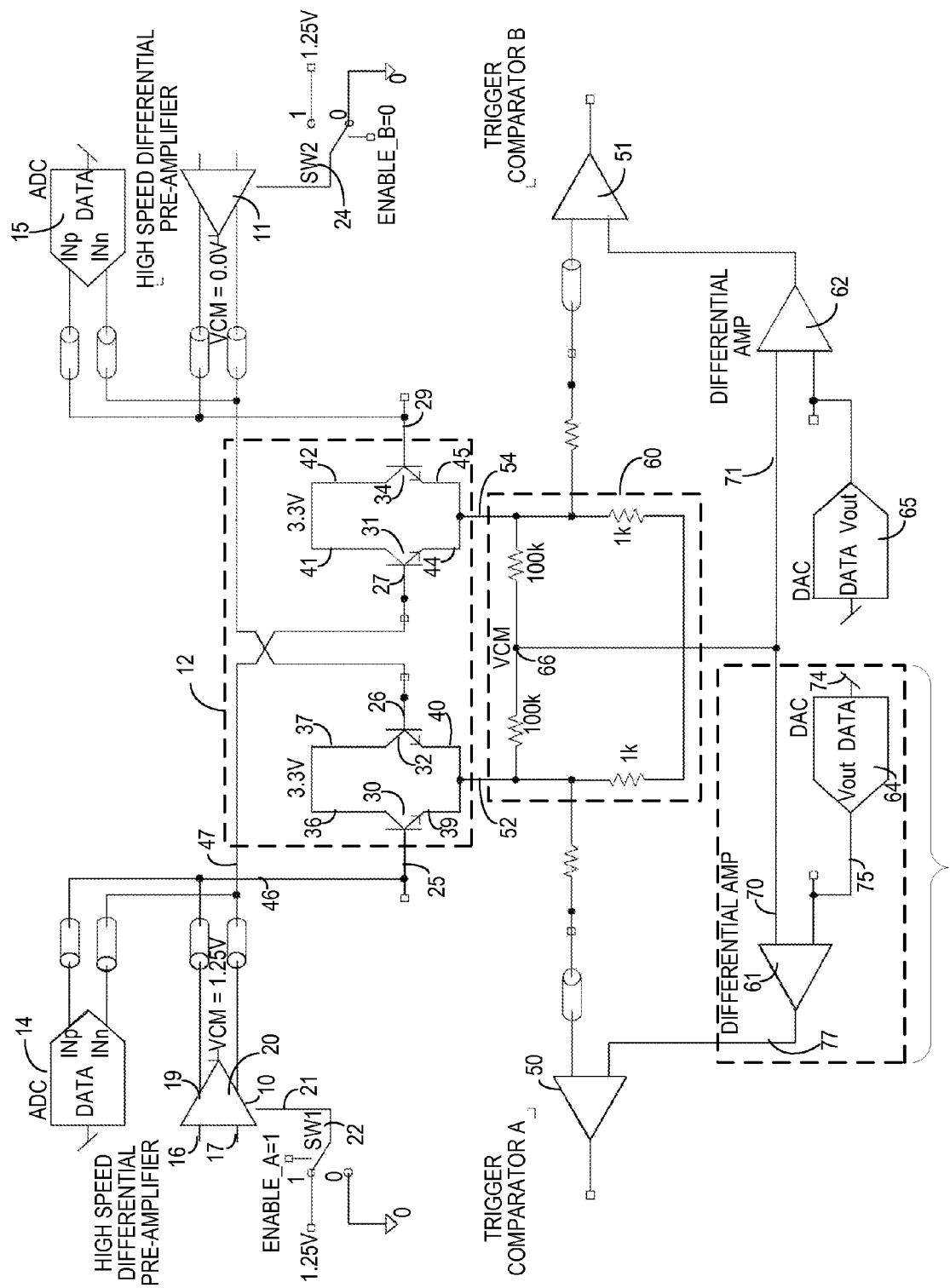
FIG. 1 is a circuit diagram depicting a circuit for driving trigger comparators.

FIG. 1 shows an implementation of the above-described circuitry. As shown in FIG. 1, the circuitry includes pre-amplifiers 10 and 11, which are electrically connected to multiplexer 12 and to corresponding analog-to-digital converters 14 and 15. In this context, electrical connection includes any type of connection that allows an electrical signal to pass between two components. Accordingly, electrical connection may include circuit paths that have intervening component(s) between two electrically-connected components.

In the example of FIG. 1, the operation of pre-amplifier 10 is described, with the understanding the pre-amplifier 11 operates in the same manner, except out of phase. Pre-amplifier 10 receives a differential signal at its input terminals 16, 17 and outputs an amplified version of the differential signal at its output terminals 19, 20. The components of the differential signal may be, e.g., 180° out of phase.

Pre-amplifier 10 is controlled by an input voltage 21, which is applied via switch 22 (e.g., a transistor). Application of a high input voltage (e.g., 1.25V) turns-on pre-amplifier 10 on so that it provides the output signal noted above. Application of a low input voltage (e.g., 0.0V) turns-off pre-amplifier 10 so that it does not provide a voltage at its output terminals. The circuitry of FIG. 1 is configured so that pre-amplifier 10 is on when pre-amplifier 11 is off, and pre-amplifier 10 is off when pre-amplifier 11 is on. That is, switches 21 and 24 are configured and/or operated so that switch 21 applies the high value to pre-amplifier 10 when switch 24 applies the low value to pre-amplifier 11, and switch 21 applies the high value to pre-amplifier 10 when switch 24 applies the low value to pre-amplifier 10.

The differential output signal (voltage) from pre-amplifier 10 is applied to an analog-to-digital controller (ADC) 14. In this example, the differential signal has a common mode voltage of 1.25V, which is the same as the high voltage input via switch 21. The circuitry, however, is not limited to use with this value for the common mode voltage. In this regard, the common mode voltage refers to the average of two node voltages, here the positive and negative outputs of pre-amplifier 10. ADC 14 receives that differential output signal and converts it from analog form to digital form for use, e.g., in the DSO of FIG. 2.

The differential output signal from pre-amplifier 10 is also applied to multiplexer 12, which also performs a buffering function. In this example, multiplexer 12 is constructed from bipolar junction transistors that are arranged in emitter-follower configurations. As shown in FIG. 1, each transistor includes a control input, namely base 25, 26, 27 and 29. The control inputs of transistors 30 and 31 are electrically connected to the output of pre-amplifier 10. The control inputs of transistors 32 and 34 are electrically connected to the output of pre-amplifier 11. Transistors 30 and 32 are electrically connected collector 36 to collector 37 and emitter 39 to emitter 40. Likewise, transistors 31 and 34 are electrically connected collector 41 to collector 42 and emitter 44 to emitter 45.

Accordingly, when pre-amplifier 10 is active, component 46 of its output differential signal turns transistor 30 on (i.e., drives it to conduction), and component 47 of its output differential signal turns transistor 31 on. Since pre-amplifier 11 is inactive when pre-amplifier 10 is active, transistors 32 and 34 are not turned-on, resulting in single-ended control by pre-amplifier 10 over the output of multiplexer 12 and thus over the inputs to trigger comparators 50 and 51.

More specifically, the current outputs along paths 52 and 54 resulting from conduction of transistors 30 and 31 produce voltage inputs at the positive terminals of corresponding trigger comparators 50 and 51. The negative terminals of trigger comparators 50 and 51 receive threshold voltages, which are produced as described below. Each trigger comparator 50, 51 compares the voltage input on its positive terminal to its threshold voltage, and outputs a signal when the voltage input exceeds the threshold voltage.

The threshold voltage is determined using compensation circuit 60 in combination with differential amplifiers 61, 62 and digital-to-analog converters 64, 65. In this implementation, compensation circuit 60 is a resistive circuit that generates a common mode voltage at an output of multiplexer 12, namely at point 66. Compensation circuit 60 is a resistive divider circuit that produces a divided voltage that is the common mode voltage. In this implementation, resistors and voltage sources associated with the multiplexer and compensation circuit are sized so that the common mode voltage at point 66 equals the common mode voltage output from pre-amplifier 10 (or 11) level shifted by the base-emitter voltage of 30 and 31 (or 32 and 34).

Changes (e.g., deviations in) the common mode voltage applied from the output of pre-amplifier 10 are tracked in the common mode voltage obtained at point 66. Furthermore, single-ended driving of the type described herein leaves the offset of the base-emitter voltage of the transistors in the multiplexer uncompensated. This can introduce uncertainty and temperature drift into the input voltage of comparators 50, 51. Such deviations in the input voltage can have a negative effect on comparison to the threshold voltage. That is, if the comparator's input voltage were to deviate, while the threshold voltage remains constant, the resulting comparison may produce erroneous results. Accordingly, the circuitry described herein uses the common mode voltage from point 66 to affect the threshold voltage so that changes in the comparator input voltage are tracked in the threshold voltage.

More specifically, the following describes the operation of circuitry 72 associated with trigger comparator 50. Circuitry 72 associated with trigger comparator 51 is identical in structure and function in this embodiment.

A digital signal 74 corresponding to a predefined voltage is applied to digital-to-analog converter (DAC) 64. DAC 64 generates a corresponding analog signal 75 and applies that analog signal to differential amplifier 61. Differential amplifier 61 also receives the common mode voltage from point 66. Differential amplifier 61 incorporates the common mode voltage from point 66 into the analog signal 75 (e.g., adds the common mode voltage into the analog signal). The resulting output 77 of the differential amplifier is the threshold voltage that is applied to comparator 50. Because a component of this threshold voltage is the common mode voltage from point 66, the threshold voltage (at the negative terminal of comparator) will vary in accordance with variations in the comparator input voltage (at the positive terminal of comparator). Since the same variations affect both signals, the differences in the voltages being compared should remain substantially constant, resulting in a relatively accurate comparison.

To summarize, FIG. 1 shows two high-speed differential pre-amplifiers 10, 11 driving two corresponding analog-to-digital (ADC) converters 14, 15. Pre-amplifiers 10, 11 also drive two trigger comparators 50, 51, via a buffer and multiplexer 12 formed by transistors 30, 31, 32 and 34. Each comparator is driven single-ended from one side of one pre-amplifier's output.

Driving trigger comparators single-ended has advantages over differential drive. Single-ended driving provides a relatively simple way to set a trigger level for a trigger comparator. Single-ended driving also simplifies buffering pre-amplifier outputs and multiplexing pre-amplifier outputs.

As explained above, transistors 30, 31, 32 and 34 form a multiplexer that electrically connects only one of differential pre-amplifiers 10, 11 to dual trigger comparators 50, 51. Transistors 30, 31, 32 and 34 provide a relatively simple way to produce a relatively high bandwidth buffer merged with a multiplexer. Discrete transistors have advantages over an integrated multiplexer. For example, the transistors buffer the differential pre-amplifier outputs, thereby isolating the transmission lines to the trigger comparators and avoiding or reducing attenuation or distortion of the ADC input signal. The transistors present relatively low capacitive loading in the transmission lines between the differential pre-amplifiers and the ADCs. The transistors are relatively fast and thereby having a reduced effect on signal bandwidth at the comparators' inputs. The transistors also have relatively low noise.

As explained above, a change in the common mode voltage at the output of the pre-amplifier that is driving the comparators is superimposed on the trigger comparators' inputs. A conventional method of addressing this problem is to precisely fix the common mode voltage. Single-ended driving also leaves the offset of the base-emitter voltage of the transistors in the multiplexer uncompensated. This introduces uncertainty and temperature drift into the comparators' input voltage, making it difficult to achieve relatively precise and stable control of the comparators' trigger levels.

The circuitry described herein addresses the foregoing problems by measuring a common mode voltage at the output of the multiplexer, and adding the measured common mode voltage to the trigger level. Changes in the pre-amplifier's common mode voltage and the base-emitter voltage are automatically tracked by the measured common mode voltage. The threshold voltage is then compensated using these changes.

The circuitry is applicable in construction of a 1 GHz DSO using commercial off-the-shelf electronic components that, at present, lack the gain, bandwidth, and loading characteristics needed to drive dual trigger comparators without corrupting the signal reaching the ADCs. It is believed that the circuitry will out-perform state-of-the-art commercial integrated circuits (ICs) because, for every technology generation, discrete transistors outperform ICs on tasks such as buffering a signal with high bandwidth and low loading. The circuitry addresses limitations of discrete transistors, namely offset voltages and temperature drift, with a compensation circuit, as described above.

Figure 2:
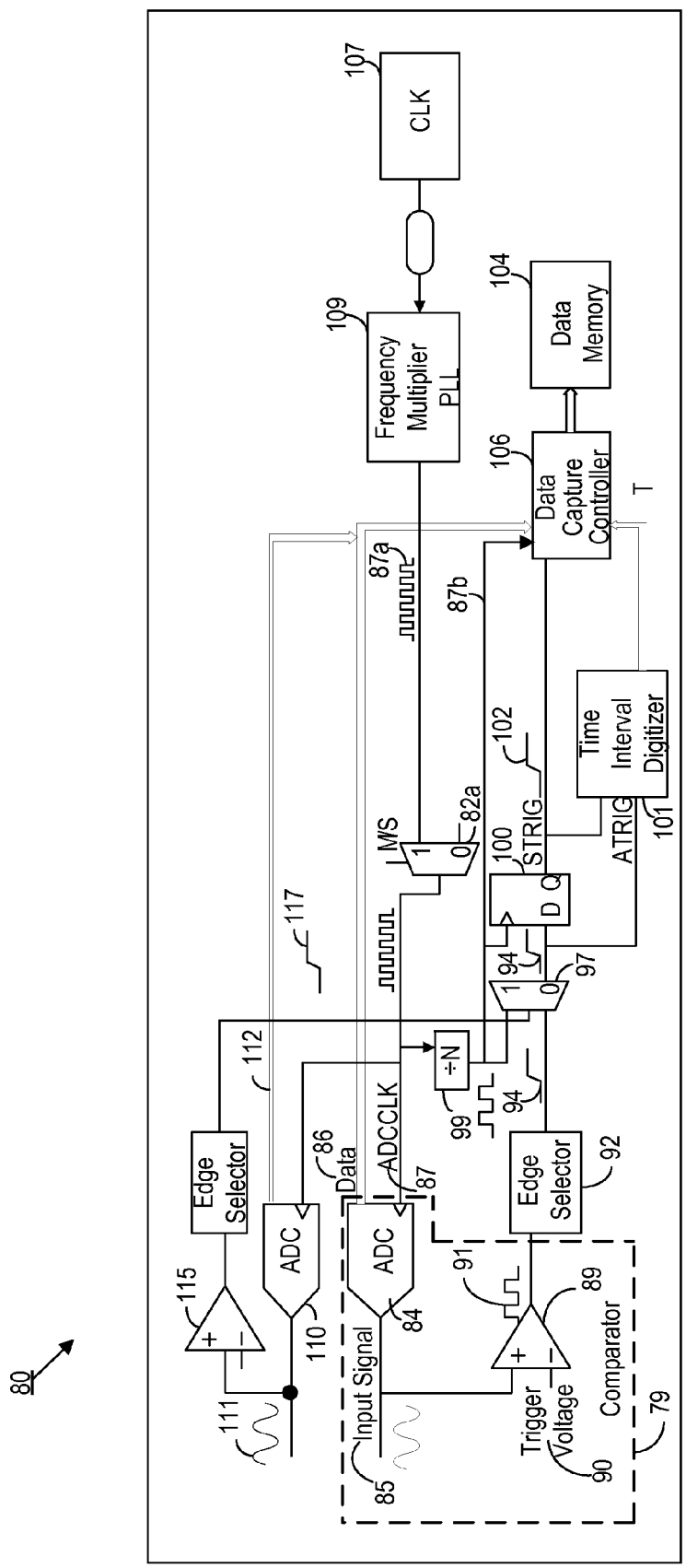
FIG. 2 is a block diagram of a digital storage oscilloscope (DSO) that may incorporate the circuit of FIG. 1.

The circuitry shown in FIG. 1 may be incorporated into the front end of a DSO, such as that shown in FIG. 2. For example, the circuitry shown in FIG. 1 may be used to implement, and supplement, the elements shown in block 79 and their counterparts in the remainder of the DSO shown in FIG. 2.

Referring to FIG. 2, DSO 80 includes an analog-to-digital converter (ADC) 84 for receiving an input analog signal 85 and for converting that analog signal to a digital signal 86 (i.e., digital data) in accordance with a clock signal 87. In this example, clock signal 87 is typically on the order of two gigahertz (2 GHz); however, any frequency may be used. The input analog signal 85 is the signal that the DSO will eventually reconstitute for display.

DSO 80 also includes a trigger comparator 89 to identify when input analog signal 85 exceeds a predefined voltage threshold. This is referred to as the threshold event, and is the point from which input analog signal 85 is referenced. Comparator 89 receives input analog signal 85 at its positive input and the voltage threshold 90 (threshold voltage) at its negative input. When input analog signal 85 exceeds voltage threshold 90, comparator 89 outputs a signal 91. Any type of signal may be used to indicate that an edge has been detected.

Figure 3:
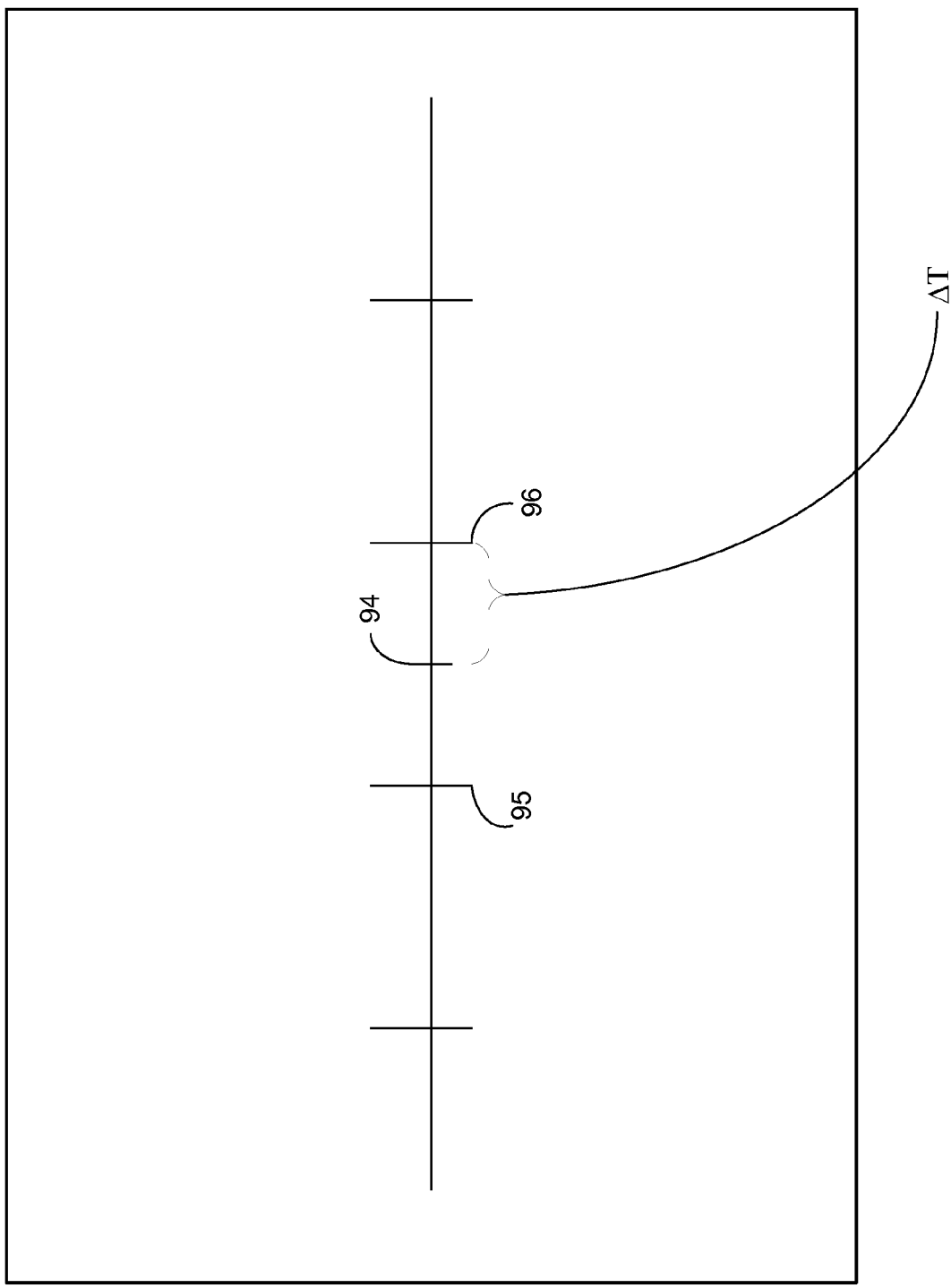
FIG. 3 is a plot showing a detected asynchronous trigger signal relative to pulses of a clock signal used to sample an input analog signal.

Edge selector 92 is a circuit that identifies either a rising edge or a falling edge of signal 91 output by comparator 89. The output of edge selector 92 constitutes an asynchronous trigger signal 94. Signal 94 is asynchronous because it is not in phase with clock signal 87. Rather, since signal 94 was detected in "real-time", it will likely fall in between two pulses 95, 96 of clock signal 87, as shown in FIG. 3. Comparators 89 and 115 may be comparators 50 and 51, respectively, of FIG. 1.

Selector circuit 97 can be a flip-flop or other circuitry that is used to select, for output, either an asynchronous trigger signal (e.g., 94) or a version of clock signal 87. A step-down circuit 99 may be used to produce the version of clock signal 87. For example, step-down circuit 99 may reduce the frequency of clock signal 87 to that desired by a user of DSO 80. That is, ADC 84 typically samples at a relatively high rate of 2 GHz. If a user wants a lower sampling rate, that rate can be set in step-down circuit 99, which may, e.g., divide the rate by a set value, N. For example, if the user would like a 100 MHz sampling rate, the user may set "N" in step-down circuit to twenty (20). The user may set this via a computer or other instrument controls communicatively coupled to DSO 80.

Assuming that selector circuit 97 selects asynchronous trigger signal 94, selector circuit 97 outputs asynchronous trigger signal 94 (ATRIG) to both a latch circuit 100 and a time interval digitizer 101. Latch circuit 100 receives asynchronous trigger signal 94 and, in accordance with clock signal 87 (the full or stepped-down version), outputs a synchronous trigger signal 102 (STRIG). Synchronous trigger signal 102 is synchronous because it is in phase with clock signal 87, unlike asynchronous trigger signal 94, which is likely not in phase with clock signal 87. In this regard, it is noted that, in some cases, synchronous trigger signal 102 and asynchronous trigger signal 94 may both be in phase with clock signal 87. These cases, however, are coincidental, and not necessarily intended.

Time interval digitizer 101 is a circuit and/or controller that determines the real-time difference ($\Delta T$, also referred to as "initial X") between the asynchronous trigger signal 94 and the clock signal 87. The phase of clock signal 87 is represented, in time interval digitizer 101, by synchronous trigger signal 102, since synchronous trigger signal 102 is in phase with clock signal 87. Referring to FIG. 3, this difference is labeled $\Delta T$. This difference, $\Delta T$, is used by a microprocessor or other processing device (not shown) to reconstruct original analog signal 85 using digital data stored in data memory 104 for display on the DSO, and to relate original analog signal 85 to the detected trigger event.

DSO 80 also includes a data capture controller 106, which may be any type of microcontroller or other processing circuitry. Data capture controller 106 receives (e.g., "captures") data from ADC 84 in accordance with clock signal 87 (the full or stepped-down version). Data capture controller 66 stores this data, along with synchronous trigger signal 102 and $\Delta T$ in data memory 104. As noted above, a microprocessor or other processing device uses this information to reconstruct the original analog signal for display on the DSO.

As shown in FIG. 2, clock signal 87 may be generated by a device 107, such as an oscillator. A frequency multiplier phase-locked loop circuit 109, or other circuitry, may optionally be used to increase the frequency of the clock.

DSO 80 may be two-channel, meaning that two separate input analog signals can be tracked relative to the same internal trigger signal. So, in FIG. 2, DSO 80 contains a second ADC 110 for receiving a second input analog signal 111. The second ADC 111 receives clock signal 87, and produces a second digital signal 112. Second digital signal 112, is provided to, and stored via, data capture controller 106 in the manner described above. DSO 80 also includes a second comparator 115 and a second edge selector circuit 116 for generating a second asynchronous trigger signal 117. These components may have the same structure and function as their counterparts described above. Selector circuit 97 selects either the first asynchronous trigger signal 94 or the second asynchronous trigger signal 117 for subsequent processing to determine ΔT. The selected asynchronous trigger signal is processed by the downstream DSO circuitry in the manner described above.

A microprocessor or other processing device or circuitry may use the digital data and ΔT values to reproduce the original analog signals, and relate them to the same triggering event.

Any of the functionality described herein and their various modifications (hereinafter "the functions"), are not limited to the hardware and software described herein. All or part of the functions can be implemented, at least in part, via a computer program product, e.g., a computer program tangibly embodied in an information carrier, such as one or more machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the functions can be performed by one or more programmable processors executing one or more computer programs to perform the functions of the calibration process. All or part of the functions can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Components of a computer include a processor for executing instructions and one or more memory devices for storing instructions and data.

Components of different embodiments described herein may be combined to form other embodiments not specifically set forth above. Components may be left out of the circuitry shown in FIGS. 1 and 2 without adversely affecting their operation. Furthermore, various separate components may be combined into one or more individual components to perform the functions described herein.

Any components of the following patent applications may be combined to produce embodiment(s) not specifically described herein: (1) U.S. patent application Ser. No. 12/769,065, entitled "Connecting Digital Storage Oscilloscopes"; (2) U.S. patent application Ser. No. 12/769,082, entitled "Driving An Electronic Instrument"; (3) U.S. patent application Ser. No. 12/769,114, entitled "Attenuator Circuit"; and (4) U.S. patent application Ser. No. 12/769,075, entitled "Multi-Level Triggering Circuit".

Other embodiments not specifically described herein are also within the scope of the following claims.

What is claimed is:

1. Circuitry comprising:

a pre-amplifier having a differential output, wherein the differential output corresponds to a common mode voltage;

a multiplexer comprised of sets of transistors, each transistor having a control input;

a comparator comprising input terminals, a first terminal of the input terminals to receive a signal that is based on an output of the multiplexer, and a second terminal of the input terminals to receive a threshold voltage;

a compensation circuit to produce a divided voltage that varies in accordance with variations in the common mode voltage; and an amplifier to receive a predefined voltage and to use the divided voltage to affect the predefined voltage to produce the threshold voltage for the comparator;

wherein signals in the differential output of the pre-amplifier are applicable to corresponding control inputs in the sets of transistors.

2. The circuitry of claim 1, wherein the control input of each transistor comprises a base, each transistor also comprising an emitter and a collector; and wherein transistors in the sets of transistors are electrically connected collector-to-collector and emitter-to-emitter.

3. The circuitry of claim 2, wherein the sets of transistor comprises two pairs of transistors, each pair of transistors being electrically connected collector-to-collector and emitter-to-emitter.

4. The circuitry of claim 1, wherein the comparator is configured to output a signal in response to the signal received by the comparator exceeding the threshold voltage.

5. The circuitry of claim 1, wherein the amplifier is configured to incorporate the divided voltage into the predefined voltage to produce the threshold voltage.

6. The circuitry of claim 1, wherein the pre-amplifier is a first pre-amplifier, the common mode voltage is a first common mode voltage, the comparator is a first comparator, the amplifier is a first amplifier; and wherein the circuitry further comprises:

a second pre-amplifier having a differential output, wherein the differential output of the second pre-amplifier corresponds to a second common mode voltage;

a second comparator comprising second input terminals, a first terminal of the second input terminals to receive a second signal that is based on a second output of the multiplexer, and a second terminal of the second input terminals to receive a second threshold voltage;

wherein the compensation circuit is configured to produce a second divided voltage that varies in accordance with variations in the second common mode voltage; and a second amplifier to receive a second predefined voltage and to use the second divided voltage to affect the second predefined voltage to produce the second threshold voltage for the second comparator;

wherein signals in the differential output of the second pre-amplifier are applicable to corresponding control inputs in the sets of transistors.

7. The circuitry of claim 6, wherein the first common mode voltage and the second common mode voltage each vary between low and high values; and wherein the circuitry further comprises:
a first switch configured to apply the high value or the low value to the first pre-amplifier; and
a second switch configured to apply the high value or the low value to the second pre-amplifier; and
wherein the first and second switches are configured so that the first switch applies the high value to the first pre-amplifier when the second switch applies the low value to the second pre-amplifier, and the second switch applies the high value to the first pre-amplifier when the first switch applies the low value to the second pre-amplifier.

8. The circuitry of claim 6, further comprising:
a first digital to analog converter configured to receive the differential output of the first pre-amplifier and, in response, to produce a first digital signal; and
a second digital to analog converter configured to receive the differential output of the second pre-amplifier and, in response, to produce a second digital signal.

9. The circuitry of claim 6, wherein the first amplifier is configured to incorporate the divided voltage into the predefined voltage to produce the threshold voltage; and
wherein the second amplifier is configured to incorporate the second divided voltage into the second predefined voltage to produce the second threshold voltage.

10. The circuitry of claim 1, wherein the transistors comprise bipolar junction transistors.

11. A digital storage oscillator (DSO) comprising:
an analog to digital converter (ADC) to convert an input analog signal into a digital signal in accordance with a clock signal;
circuitry to generate a trigger signal, the circuitry comprising:
a pre-amplifier having a differential output, wherein the differential output corresponds to a common mode voltage;
a multiplexer comprised of sets of transistors, each transistor having a control input;
a comparator comprising input terminals, a first terminal of the input terminals to receive a signal that is based on an output of the multiplexer, and a second terminal of the input terminals to receive a threshold voltage;
a compensation circuit to produce a divided voltage that varies in accordance with variations in the common mode voltage; and
an amplifier to receive a predefined voltage and to use the divided voltage to affect the predefined voltage to produce the threshold voltage for the comparator;
wherein signals in the differential output of the pre-amplifier are applicable to corresponding control inputs in the sets of transistors;
an edge selector to identify a rising or falling edge of a signal output by the comparator and to produce an asynchronous trigger signal; and
a latch to output the trigger signal based on the asynchronous trigger signal and a version of a clock signal; and
a time interval digitizer to determine a time difference that is based on the asynchronous trigger signal, the time difference being a difference between an actual time that a trigger event occurred and a time that a clock signal running the ADC occurred.

12. The DSO of claim 11, further comprising:
memory; and
a controller to capture data from the ADC based on the time difference, and to store the data in the memory.

13. The DSO of claim 1, wherein the sets of transistor comprises two pairs of transistors, each pair of transistors being electrically connected collector-to-collector and emitter-to-emitter.

14. The DSO of claim 11, wherein the comparator is configured to output a signal in response to the signal received by the comparator exceeding the threshold voltage.

15. The DSO of claim 11, wherein the amplifier is configured to incorporate the divided voltage into the predefined voltage to produce the threshold voltage.

16. The DSO of claim 11, wherein the pre-amplifier is a first pre-amplifier, the common mode voltage is a first common mode voltage, the comparator is a first comparator, the amplifier is a first amplifier; and
wherein the circuitry further comprises:
a second pre-amplifier having a differential output, wherein operation of the second preamplifier is responsive to a second common mode voltage;
a second comparator comprising second input terminals, a first terminal of the second input terminals to receive a second signal that is based on a second output of the multiplexer, and a second terminal of the second input terminals to receive a second threshold voltage;
wherein the compensation circuit is configured to produce a second divided voltage that varies in accordance with variations in the second common mode voltage; and
a second amplifier to receive a second predefined voltage and to use the second divided voltage to affect the second predefined voltage to produce the second threshold voltage for the second comparator;
wherein signals in the differential output of the second pre-amplifier are applicable to corresponding control inputs in the sets of transistors.

17. The DSO of claim 16, wherein the first common mode voltage and the second common mode voltage each vary between low and high values; and
wherein the circuitry further comprises:
a first switch configured to apply the high value or the low value to the first pre-amplifier; and
a second switch configured to apply the high value or the low value to the second pre-amplifier; and
wherein the first and second switches are configured so that the first switch applies the high value to the first pre-amplifier when the second switch applies the low value to the second pre-amplifier, and the second switch applies the high value to the first pre-amplifier when the first switch applies the low value to the second pre-amplifier.

18. A method of driving trigger comparators of a digital storage oscilloscope, the method comprising:
controlling a set of pre-amplifiers so that a differential output from only one of the set of pre-amplifiers is applied to a multiplexer comprised of sets of transistors that are electrically connected to enable the differential output to control application of signals to a set of comparators;
applying a threshold voltage to each comparator in the set of comparators; and
outputting, from each comparator, a signal that is based on a corresponding threshold voltage and a corresponding signal applied as a result of the differential output.

19. The method of claim 18, wherein the differential output has a common mode voltage; and wherein the method further comprises:

tracking changes corresponding to the common mode voltage; and compensating the threshold voltage for the changes.

20. The method of claim 19, wherein compensating the threshold voltage comprises incorporating, into the threshold voltage, a voltage that corresponds to the changes.

* * * * *